United States Patent
Ro et al.

(10) Patent No.: US 7,817,479 B2
(45) Date of Patent: Oct. 19, 2010

(54) NONVOLATILE MEMORY DEVICE USING A VARIABLE RESISTIVE ELEMENT AND ASSOCIATED OPERATING METHOD

(75) Inventors: Yu-Hwan Ro, Seocho-gu (KR); Byung-Gil Choi, Yongin-si (KR); In-Cheol Shin, Osan-si (KR)

(73) Assignee: Samsung electronics Co., Ltd., Suwon-si, Gyeonggi-do (KR)

( * ) Notice: Subject to any disclaimer, the term of this patent is extended or adjusted under 35 U.S.C. 154(b) by 170 days.

(21) Appl. No.: 12/136,822

(22) Filed: Jun. 11, 2008

(65) Prior Publication Data
US 2009/0003048 A1    Jan. 1, 2009

(30) Foreign Application Priority Data
Jun. 28, 2007    (KR) .................. 10-2007-0064600

(51) Int. Cl.
G11C 16/04    (2006.01)
(52) U.S. Cl. ..................... 365/189.09; 365/230.06; 365/189.11; 365/189.06
(58) Field of Classification Search ............... 365/163, 365/230.06, 189.09, 148, 189.11, 189.14, 365/189.06
See application file for complete search history.

(56) References Cited

U.S. PATENT DOCUMENTS 7,099,199 B2 * 8/2006 Seki et al. .............. 365/185.29
7,259,982 B2 * 8/2007 Johnson ..................... 365/163
7,280,390 B2 * 10/2007 Kostylev et al. ............ 365/163
7,283,387 B2 * 10/2007 Cho et al. .................. 365/163
7,352,645 B2 * 4/2008 Sforzin et al. .............. 365/227

FOREIGN PATENT DOCUMENTS

| JP | 2005135458 A | 5/2005 |
|---|---|---|
| JP | 2006-040466 | 9/2006 |
| KR | 100172380 B1 | 10/1998 |
| KR | 1019990015874 A | 3/1999 |
| KR | 1020030058287 A | 7/2003 |

* cited by examiner

Primary Examiner—David Lam
(74) Attorney, Agent, or Firm—Volentine, Whitt, PLLC

(57) ABSTRACT

A nonvolatile memory device that utilizes both a voltage provided outside the memory device and a voltage generated within the device instead of using only a voltage generated within the device as a driving voltage avoids malfunctions of the memory device when instantaneous significant voltage drops occur. The nonvolatile memory device includes a plurality of nonvolatile memory cells, a bit line coupled to at least a portion of the plurality of nonvolatile memory cells, a column-selection transistor coupled to the bit line and a driving circuit. The driving circuit is coupled to a gate of the column-selection transistor and is configured to supply a charge to the gate using a first voltage and a second voltage wherein the second voltage is higher than the first voltage.

20 Claims, 12 Drawing Sheets

NONVOLATILE MEMORY DEVICE USING A VARIABLE RESISTIVE ELEMENT AND ASSOCIATED OPERATING METHOD

CROSS REFERENCE TO RELATED APPLICATION

This application claims the benefit of Korean Patent Application No. 10-2007-0064600 filed on Jun. 28, 2007, in the Korean Intellectual Property Office, the disclosure of which is incorporated herein in its entirety by reference.

BACKGROUND OF THE INVENTION

1. Field of the Invention

Embodiments of the invention relate to a nonvolatile memory device. More particularly, embodiments of the invention relate to a nonvolatile memory device using a variable resistive element and an associated operation method.

2. Discussion of Related Art

Next generation nonvolatile memory devices are being developed for use in portable consumer products to provide high capacity and low power consumption. These memory devices include, for example, PRAMs (Phase change Random Access Memory) utilizing phase-change material such as a chalcogenide alloy that can be switched between two states, RRAMs (Resistance Random Access Memory) employing material having a variable resistance characteristic of complex metal oxides, and MRAMs (Magnetic Random Access Memory) utilizing the resistance change of MTJ (Magnetic Tunnel Junction) thin films according to the magnetization state of a ferromagnetic substance. The resistance value is maintained in these devices even when no current or voltage is supplied demonstrating nonvolatile memory characteristics.

For example, the phase change material used in a phase change memory cell changes into a crystal state or amorphous state by cooling after heating. The phase-change material in the crystal state has a low resistance defining set data (0) and the phase-change material in the amorphous state has a high resistance defining reset data (1). In order to operate the phase change multiple voltage levels for example, 1.5, 3, 4, and 5 V are needed. A driving-voltage-generating circuit generates these multiple driving voltages by utilizing an external supply voltage as an input. However, if a driving voltage (for example, a boosting voltage) generated by a particular driving-voltage-generating circuit is significantly used in a short period of time, the driving voltage level may be instantaneously dropped. As a result, malfunctions may be introduced into the circuit using this driving voltage inside the phase change memory device.

SUMMARY OF THE INVENTION

Exemplary embodiments of the present invention are directed to a nonvolatile memory device with a resistive element that prevents erroneous operations. A nonvolatile memory device includes a plurality of nonvolatile memory cells, a bit line, a column-selection transistor and a driving circuit. The bit line is coupled to at least a portion of the plurality of nonvolatile memory cells. The column-selection transistor is coupled to the bit line. The driving circuit is coupled to the column-selection transistor and is configured to supply a charge to a gate of the column-selection transistor using a first voltage and a second voltage wherein the second voltage is higher than the first voltage.

DESCRIPTION OF EMBODIMENTS

Figure 1:
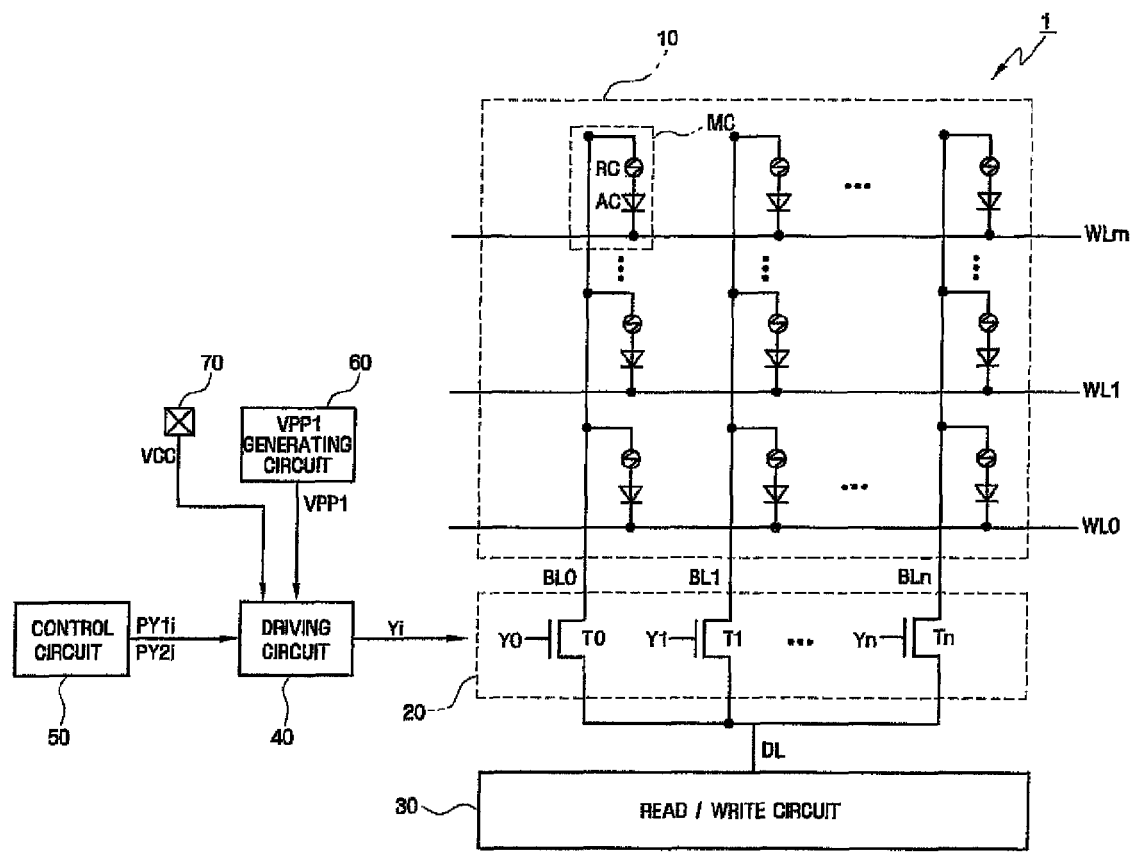
FIG. 1 is a block diagram illustrating a nonvolatile memory device according to a first exemplary embodiment of the present invention.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout. It will be understood that when an element is referred to as being "connected to" or "coupled to" another element, it can be directly connected to or coupled to the other element or intervening elements may also be present. In addition, although exemplary embodiments of the present invention will be described utilizing a phase change random access memory (PRAM) device, the principles can be applied to various types of nonvolatile memory devices, for example, devices having a resistive element (RRAM) and ferroelectric RAM (FRAM).

FIG. 1 is a block diagram illustrating a nonvolatile memory device 1 including a memory cell array 10, a column selection circuit 20, a read/write circuit 30, a driving circuit 40, a control circuit 50, a VPP1-generating-circuit 60, and a VCC input pad 70. Memory cell array 10 includes a plurality of nonvolatile memory cells MC arranged in a matrix where each of the memory cells MC are coupled between word lines WL0-WLm and bit lines BL0-BLn. Nonvolatile memory cell MC can have a variable resistive element RC including a phase-change material that has two different resistances corresponding to a crystal state and an amorphous status, as well as an access element AC that controls current flow in variable resistive element RC. The access element may be, for example, a diode or transistor coupled to variable resistive element RC in series. The phase-change material may employ various materials including two-element compounds (GaSb, InSb, InSe, Sb2The3, or GeTe), three-element compounds (GeSbTe, GaSeTe, InSbTe, SnSb2Te4, or InSbGe), or four-element compounds (AgInSbTe, (GeSn)SbTe, GeSb(SeTe), or Te81Ge15Sb2S2). GeSbTe consisting of germanium (Ge), antimony (Sb), and tellurium (Te), is preferably used.

Driving circuit 40 is coupled to column selection circuit 20 and is configured to select at least one bit line (for example, BL0) among bit lines BL0-BLn via input selection signals Yi (Y0-YN). Column selection circuit 20 includes a plurality of column-selection transistors T0-TN coupled to respective bit lines BL0-BLn. Driving circuit 40 charges a gate of the column-selection transistor using the first voltage VCC, and then charges the gate of the column-selection transistor using the second voltage VPP1 which is higher than the first voltage VCC. In particular, selection signal Yi is increased to the level of a first voltage (for example, VCC), and then it is increased to a second voltage level (for example, VPP1) which is higher than the level of the first voltage VCC illustrated in FIG. 2.

Figure 2:
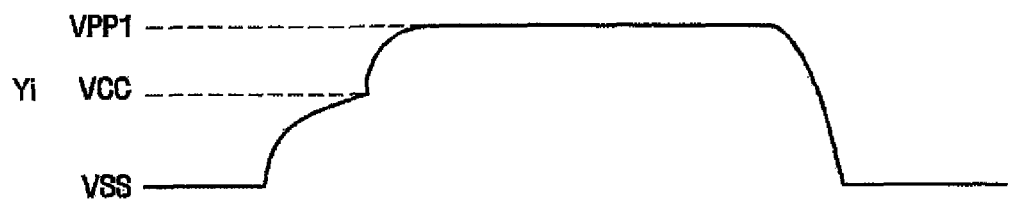
FIG. 2 is a graph illustrating a waveform of the selection signal shown in FIG. 1.

External source voltage VCC is used as an example of the first voltage and boosting voltage VPP1 is used as an example of the second voltage. Although the voltage waveform shown in FIG. 2 is increased in two steps, the voltage may be increased in three or more steps. In this manner, by increasing the voltage in multiple steps the stress introduced to the phase change memory device by increasing selection signal Yi to too high a voltage level (e.g. the boosting voltage level) in a single step is avoided. In particular, driving circuit 40 generates selection signal Yi using first supplied voltage VCC and generates second voltage VPP1. Driving circuit 40 takes first voltage VCC via voltage input pad 70 and second voltage VPP1 from voltage generation circuit 60 from inside the device. Driving circuit 40 then generates selection signal Yi which is increased in multiple steps by responding to first and second control signals PY1i, PY2i provided by control circuit 50. Thus, if both the voltage provided externally from the device and the voltage generated by the device are used rather than using only the voltage generated by the device, a significant drop of second voltage VPP1 in a short period of time caused by using second voltage VPP1 generated by the voltage generation circuit 60 can be avoided. In addition, the malfunctions of the circuits using the second voltage VPP1 within the nonvolatile memory device can be avoided thereby improving device reliability. Selection signal Yi may also be generated using multiple voltages from the device if the load of each voltage-generating circuit can be reduced.

Figure 3A:
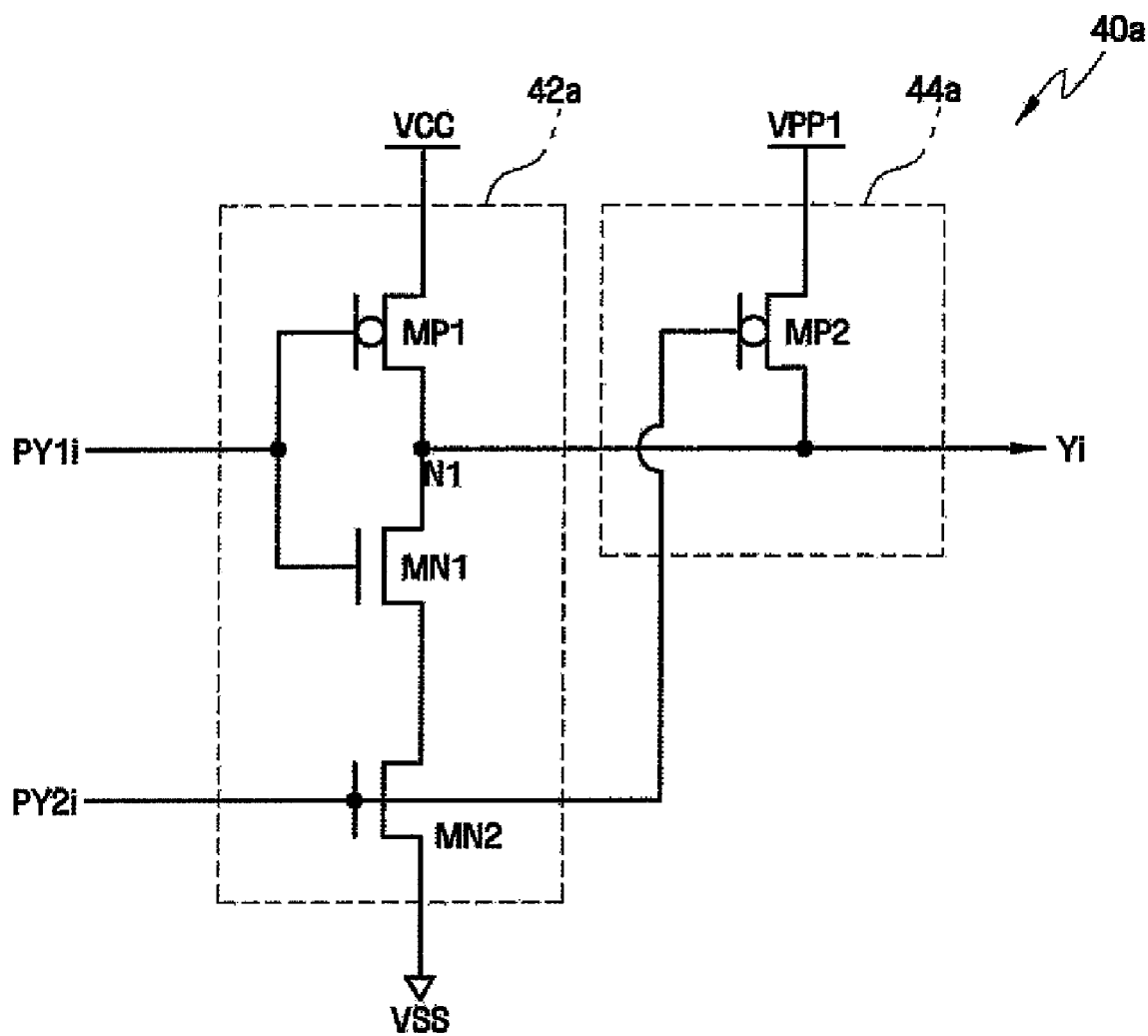
FIGS. 3A through 3C are circuit diagrams illustrating the driving circuit shown in FIG. 1.
Figure 3B:
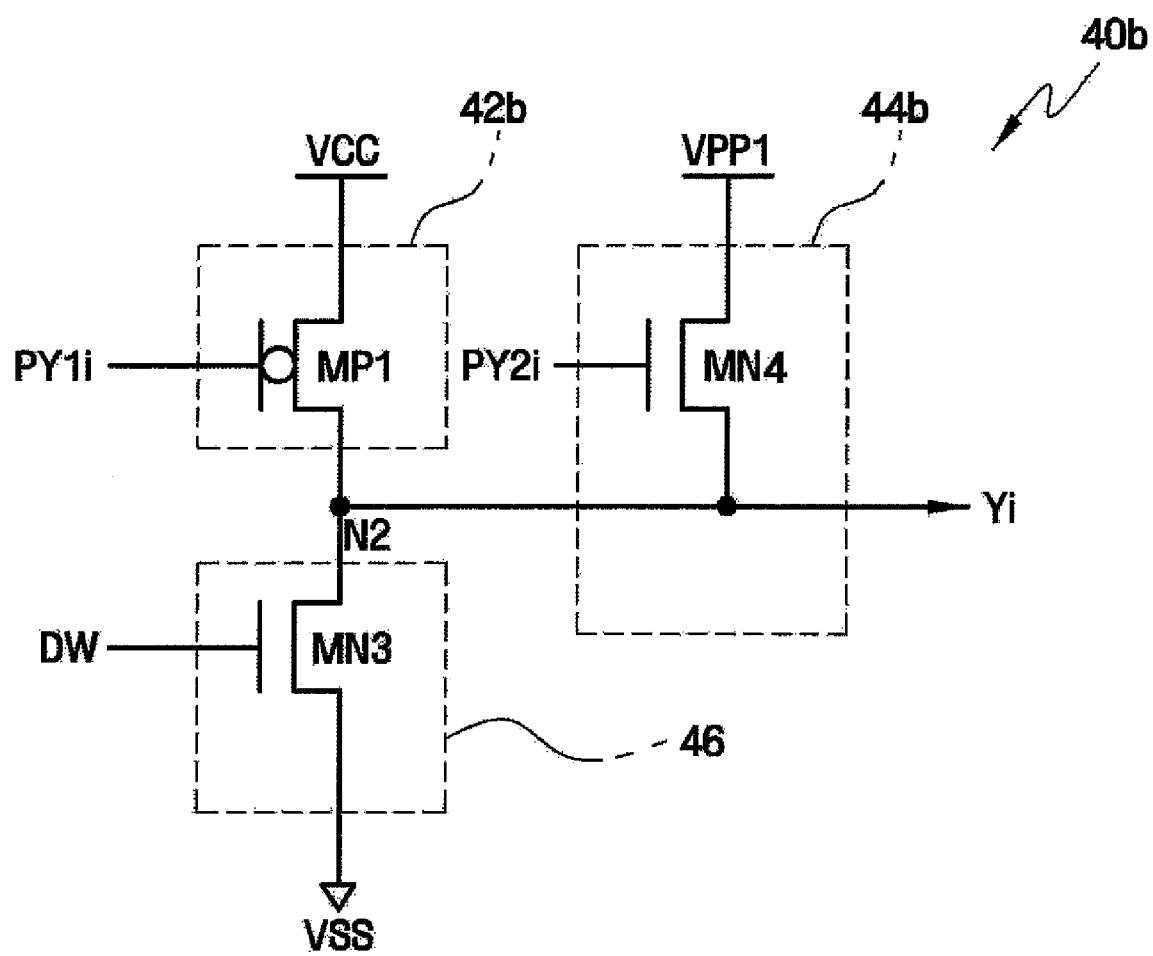
Figure 3C:
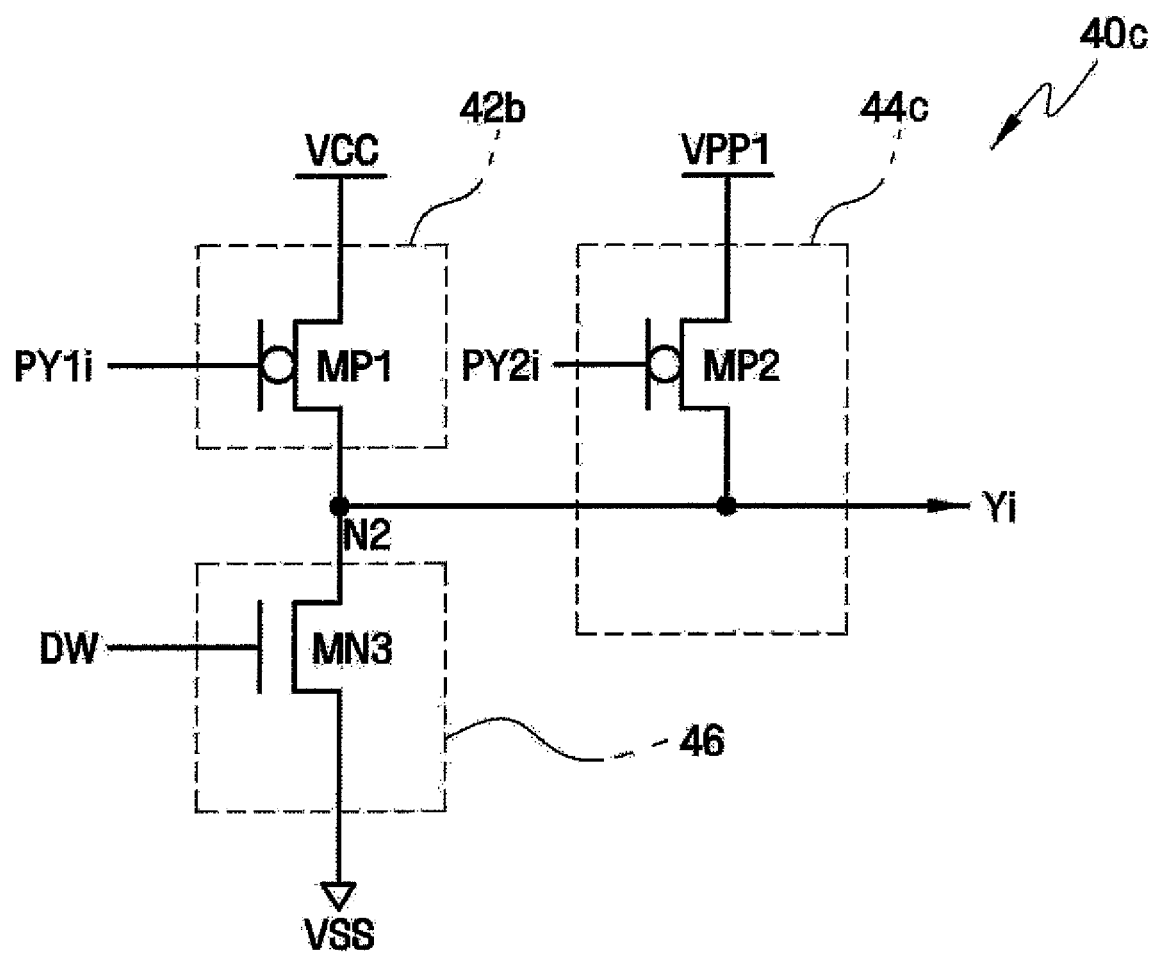

FIGS. 3A through 3C are circuit diagrams illustrating the driving circuits 40a and 40b. Driving circuit 40A of FIG. 3A includes a first sub-driving unit 42a and second sub-driving unit 44a. First voltage VCC is supplied to first sub-driving unit 42a based on the input of first control signal PY1i. Second voltage VPP1 is supplied to second sub-driving unit 44a based on the input of second control signal PY2i. First sub-driving unit 42a includes PMOS transistor MP1 and NMOS transistors MN1 and MN2. Transistor MP1 is coupled between voltage VCC and output node N1 and transistors MN1, MN2 are coupled in series between output node N1 and ground voltage. First control signal PY1i is inputted to the gate of transistor MP1 and the gate of transistor MN1. Second control signal PY2i is inputted to the gate of NMOS transistor MN2. Second sub-driving unit 44a is coupled between second voltage VPP1 and output node N1 where second control signal PY2i in supplied to the gate of PMOS transistor MP2.

Next, referring to FIG. 3B, the driving circuit 40b of FIG. 3B includes first sub-driving unit 42b, second sub-driving unit 44b and pull down unit 46. First sub-driving unit 42b provides first voltage VCC based on the input of first control signal PY1i. Second sub-driving unit 44b provides second voltage VPP1 based on the input of second control signal PY2i. Pull down unit 46 pulls down output node N2. Driving circuit 40b has fewer NMOS transistors and more control signals as compared to driving circuit 40a shown in FIG. 3A. First sub-driving unit 42b includes PMOS transistor MP1 coupled between first voltage VCC and output node N2. First control signal PY1i is supplied to the gate of transistor MP1. Second sub-driving unit 44b includes NMOS transistor MN4 coupled between second voltage VPP1 and output node N2. Second control signal PY2i is supplied to the gate of transistor MN4. Pull down unit 46 includes NMOS transistor MN3 coupled between output node N2 and ground voltage. Third control signal DW is supplied to the gate of transistor MN3. Second control signal PY2i may be, for example, a signal that swings between the ground voltage and second voltage VPP1. The difference between driving circuit 40c illustrated in FIG. 3C and driving circuit 40b illustrated in FIG. 3B is PMOS transistor MP2 in second sub-driving unit 44c of driving circuit 40c shown in FIG. 3C.

Figure 4:
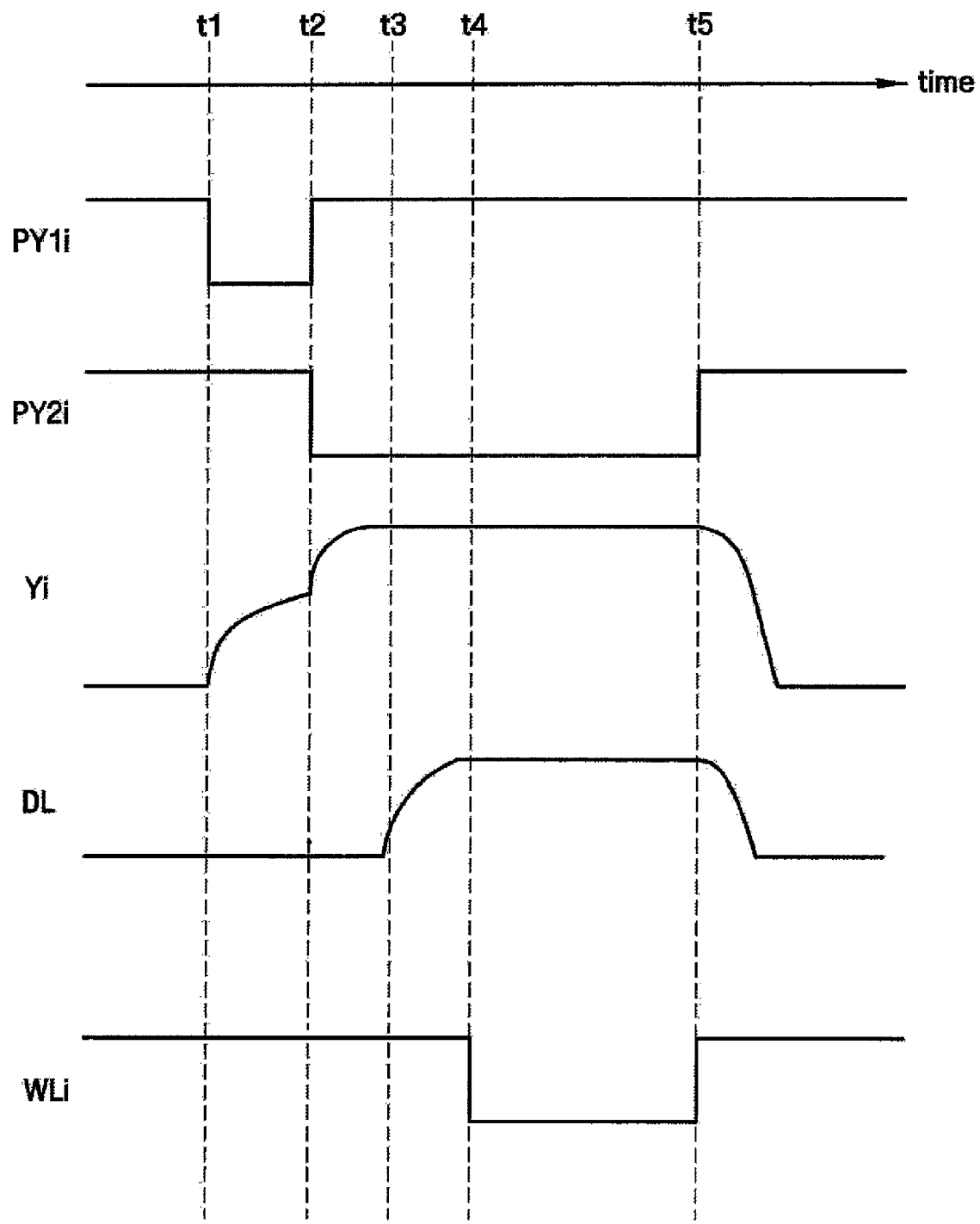
FIG. 4 is a timing diagram illustrating operations of the nonvolatile memory device according to the first exemplary embodiment of the present invention.

The operation of non-volatile memory device 1 will be described with reference to FIGS. 1, 3A, and 4. At time t1, first control signal PY1i is low which turns on PMOS transistor MP1 of first sub-driving unit 42a. The level of selection signal Yi is increased to first voltage level VCC. Thus, first sub-driving unit 42a charges the gate of the column-selection transistor using first voltage VCC. At time t2, first control signal PY1i becomes high and the second control signal PY2i becomes a low. As a result, PMOS transistor MP1 of first sub-driving unit 42a is turned off and PMOS transistor MP2 of second sub-driving unit 44a is turned on. Although NMOS transistor MN1 is turned on, the voltage level of output node N1 does not drop since NMOS transistor MN2 is off. Thus, selection signal Yi increases to second voltage VPP1. Second sub-driving unit 42b charges the gate of column-selection transistor using second voltage VPP1 and fully turns the gate of column-selection transistor on.

At time t3, read/write circuit 30 provides operating current for nonvolatile memory device 1 through data line DL. For example, read/write circuit 30 provides read current during read operations and provides write current such as a set pulse or a reset pulse during write operations. At time t4, one word line WLi is selected among the plurality of word lines WL0-WLm. As a result, the current generated by read/write circuit 30 flows through data line DL, the column-selection transistor, the bit line BLi, the selected memory cell MC, and word line WLi. At time t5, second control signal PY2i becomes high.

Figure 5:
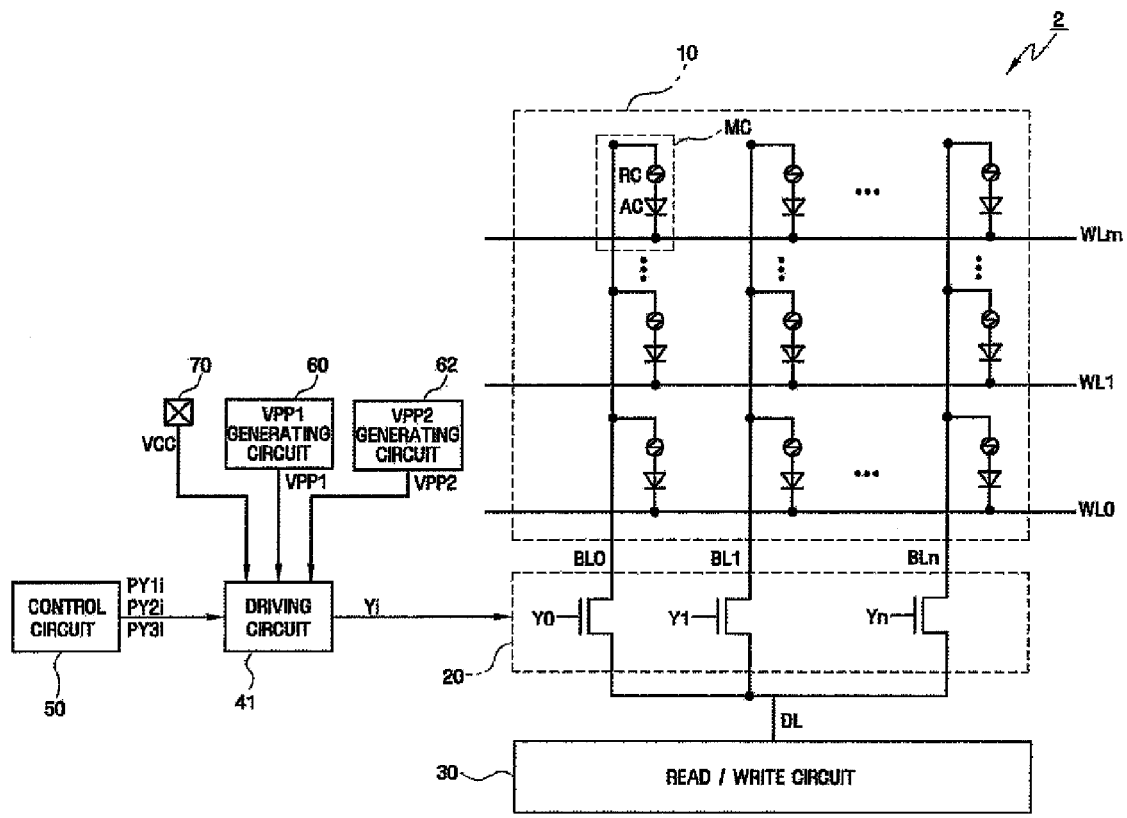
FIG. 5 is a block diagram illustrating a nonvolatile memory device according to a second exemplary embodiment of the present invention.
Figure 6:
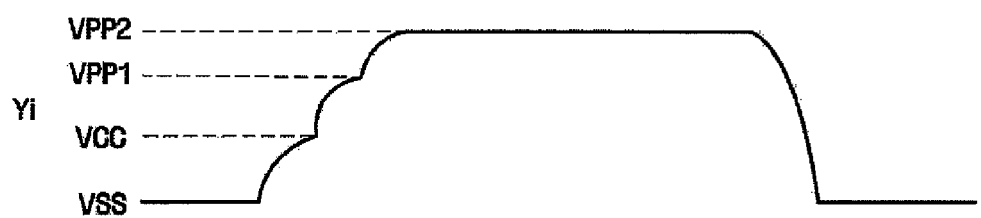
FIG. 6 is a waveform illustrating the selection signal shown in FIG. 5.

FIG. 5 is a block diagram illustrating a nonvolatile memory device and FIG. 6 is a waveform of selection signal Yi shown in FIG. 5. Nonvolatile memory device 2 provides selection signal Yi which is generated by driving circuit 41. Selection signal Yi is increased in three steps. In particular, driving circuit 41 receives first voltage VCC externally via voltage input pad 70, second voltage VPP1 and third voltage VPP2 from voltage-generating circuits 60 and 62 within device 2. Driving circuit 41 generates selection signal Yi which is increased in multiple steps by responding to the first, second, and third control signals PY1i, PY2i, PY3i respectively provided by control circuit 50. Thus, driving circuit 41 charges the gate of the column-selection transistor using first voltage VCC and then charges the gate of the column-selection transistor using second voltage VPP1 which is higher than first voltage VCC. Driving circuit 41 then charges the gate of the column-selection transistor using third voltage VPP2 which is higher than second voltage VPP1.

Figure 7:
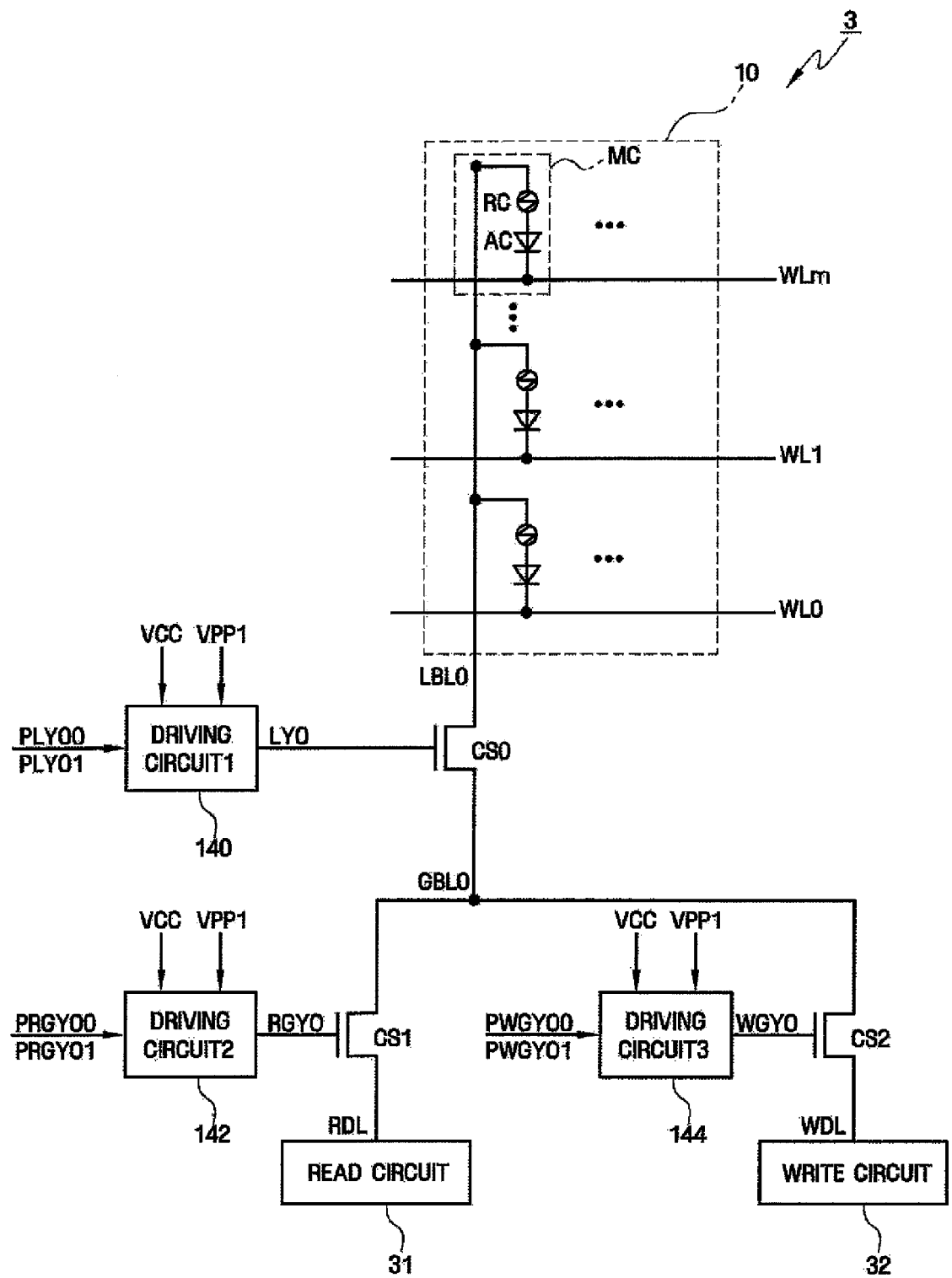
FIG. 7 is a block diagram illustrating a nonvolatile memory device according to a third exemplary embodiment of the present invention.
Figure 8:
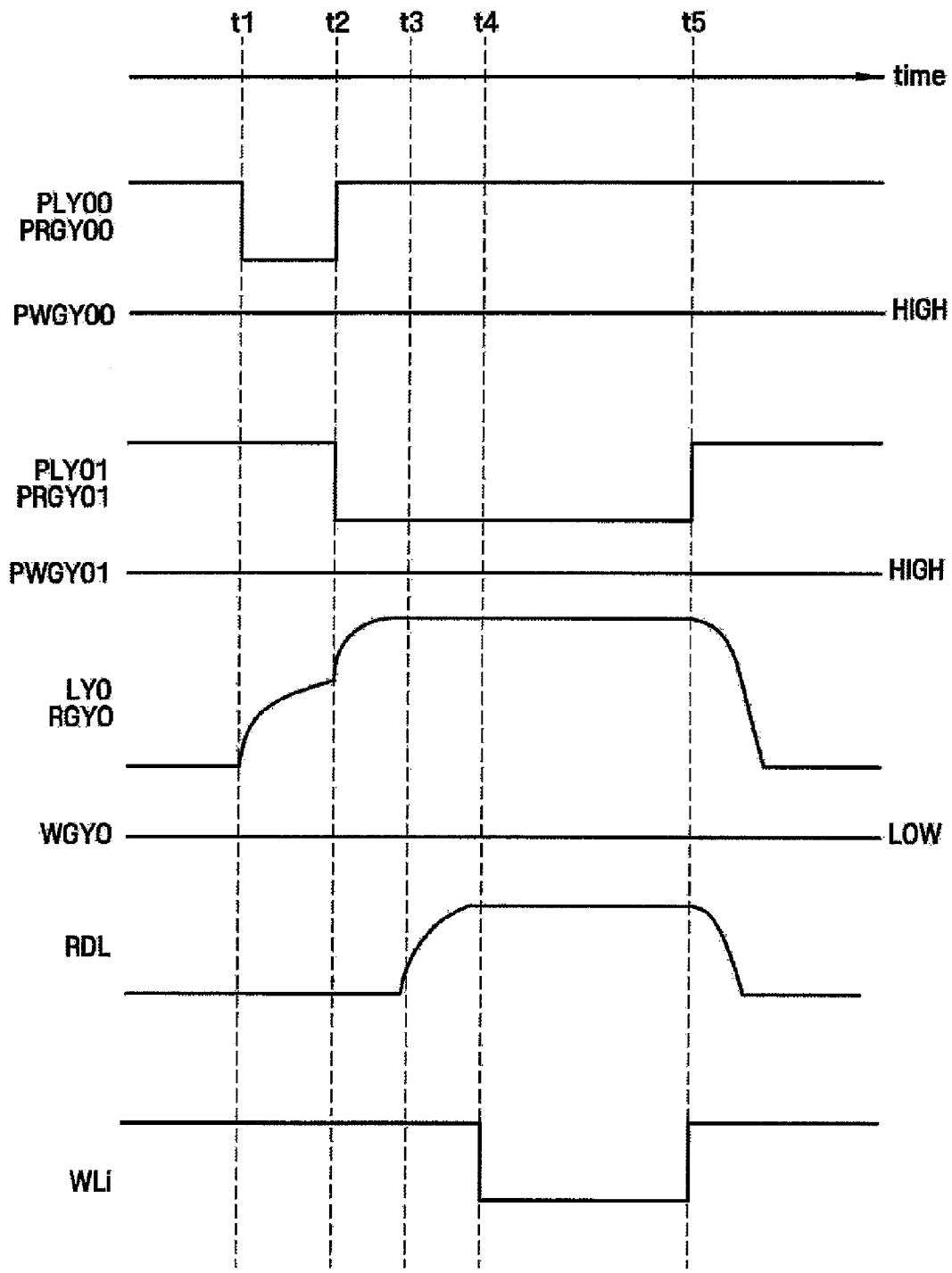
FIG. 8 is a timing diagram illustrating operation of the nonvolatile memory device according to the third exemplary embodiment of the present invention.

FIG. 7 is a block diagram illustrating a nonvolatile memory device 3 and FIG. 8 is an associated timing diagram. Nonvolatile memory device 3 includes a hierarchical bit line structure which is an efficient structure for nonvolatile memory devices having high density and high integration. The bit lines can be divided into a local bit line LBL0 and a global bit line GBL0. Local bit line LBL0 is coupled to a plurality of nonvolatile memory cells. A first column-selection transistor CS0 is coupled between the local bit line LBL0 and global bit line GBL0 and receives local selection signal LY0 as a gate input. Second column-selection transistor CS1 is coupled between first data line RDL which is coupled to read circuit 31 and global bit line GBL0 and receives first global selection signal RGY0 as a gate input. A third column-selection transistor CS2 is coupled between second data line WDL which is coupled to write circuit 32 and global bit line GBL0 and receives second global selection signal WGY0 as a gate input.

The local selection signal LY0, first global selection signal RGY0, and second global selection signal WGY0 are increased to a certain level (for example a boosting voltage level) in multiple steps. In particular, first driving circuit 140, second driving circuit 142, and third driving circuit 144 are coupled with first column-selection transistor CS0, second column-selection transistor CS1, and third column-selection transistor CS2 respectively similar to that shown in FIG. 3A. First driving circuit 140 receives control signals PLY00, PLY01 as inputs and charges the gate of first column-selection transistor CS0 using second voltage VPP1 after charging the gate using a first voltage VCC. Second driving circuit 142 receives control signals PRGY00, PRGY01 as inputs and charges the gate of second column-selection transistor CS1 using second voltage VPP1 after charging the gate using first voltage VCC. Third driving circuit 144 receives control signals PWGY00, PWGY01 as inputs and charges the gate of third column-selection transistor CS2 using second voltage VPP1 after charging the gate using the first voltage VCC.

In a read operation at time t1, control signals PLY00, PRGY00 become low. Local selection signal LY0 and first global selection signal RGY0 increase to first voltage level VCC. Since control signals PWGY00, PWGY01 maintain a high level, second global selection signal WGY0 holds at a low level. At time t2, control signals PLY00, PRGY00 become high, and control signals PLY01, PRGY01 become low. Thus, local selection signal LY0 and first global selection signal RGY0 go up to second voltage level VPP. Since control signals PWGY00, PWGY01 maintain a high level, second global selection signal WGY0 holds at a low level.

At time t3, read circuit 31 provides read current via first data line RDL. At time t4, a word line WLi is selected among the plurality of word lines WL0-WLm. As a result, the current generated by read circuit 31 flows through first data line RDL, second column-selection transistor CS1, global bit line GBL0, first column-selection transistor CS0, local bit line LBL0, selected memory cell MC, and word line WLi. At time t5, control signals PLY01 and PRGY01 become high.

Figure 9:
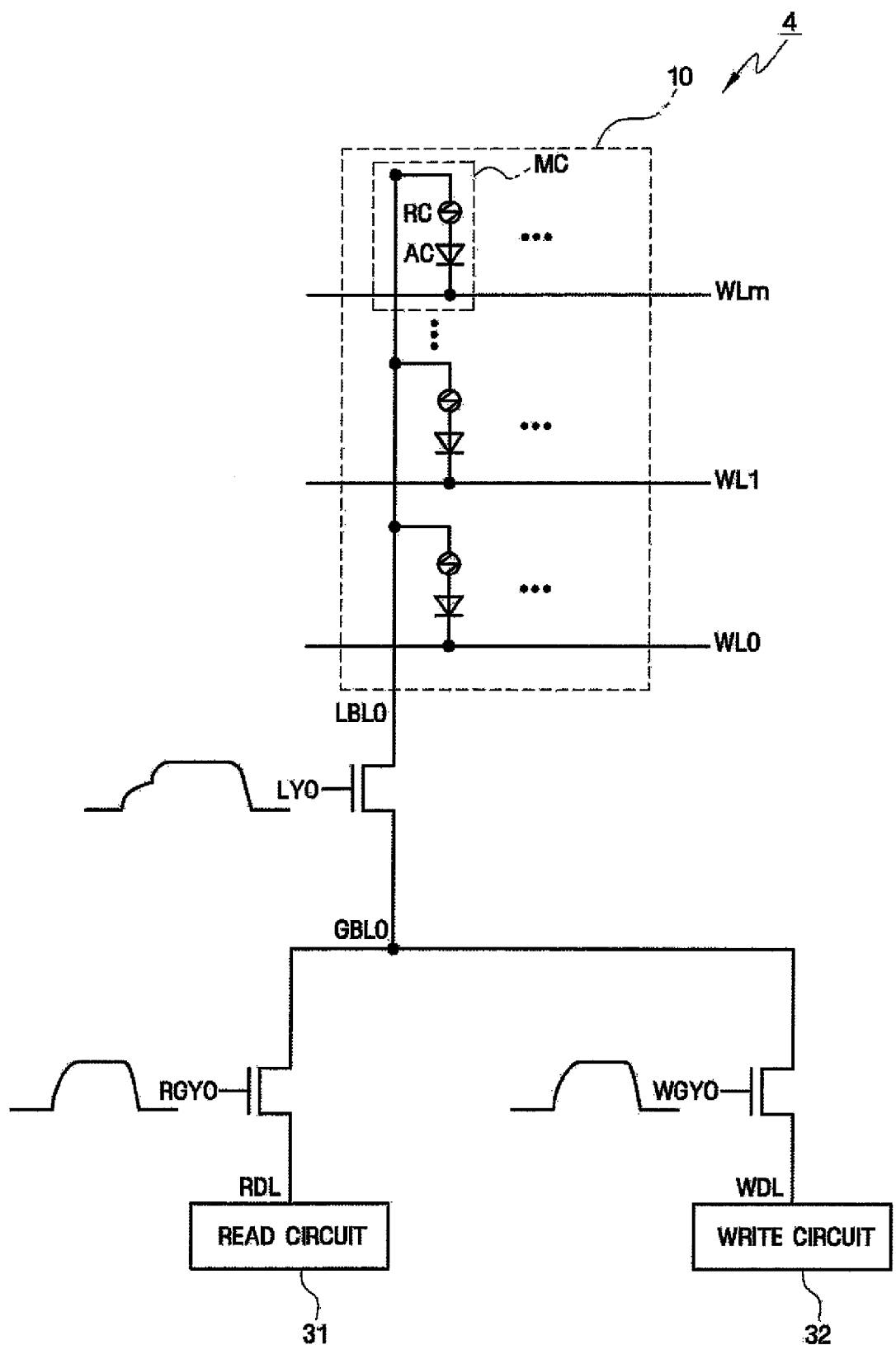
FIG. 9 is a block diagram illustrating a nonvolatile memory device according to a fourth exemplary embodiment of the present invention.
Figure 10:
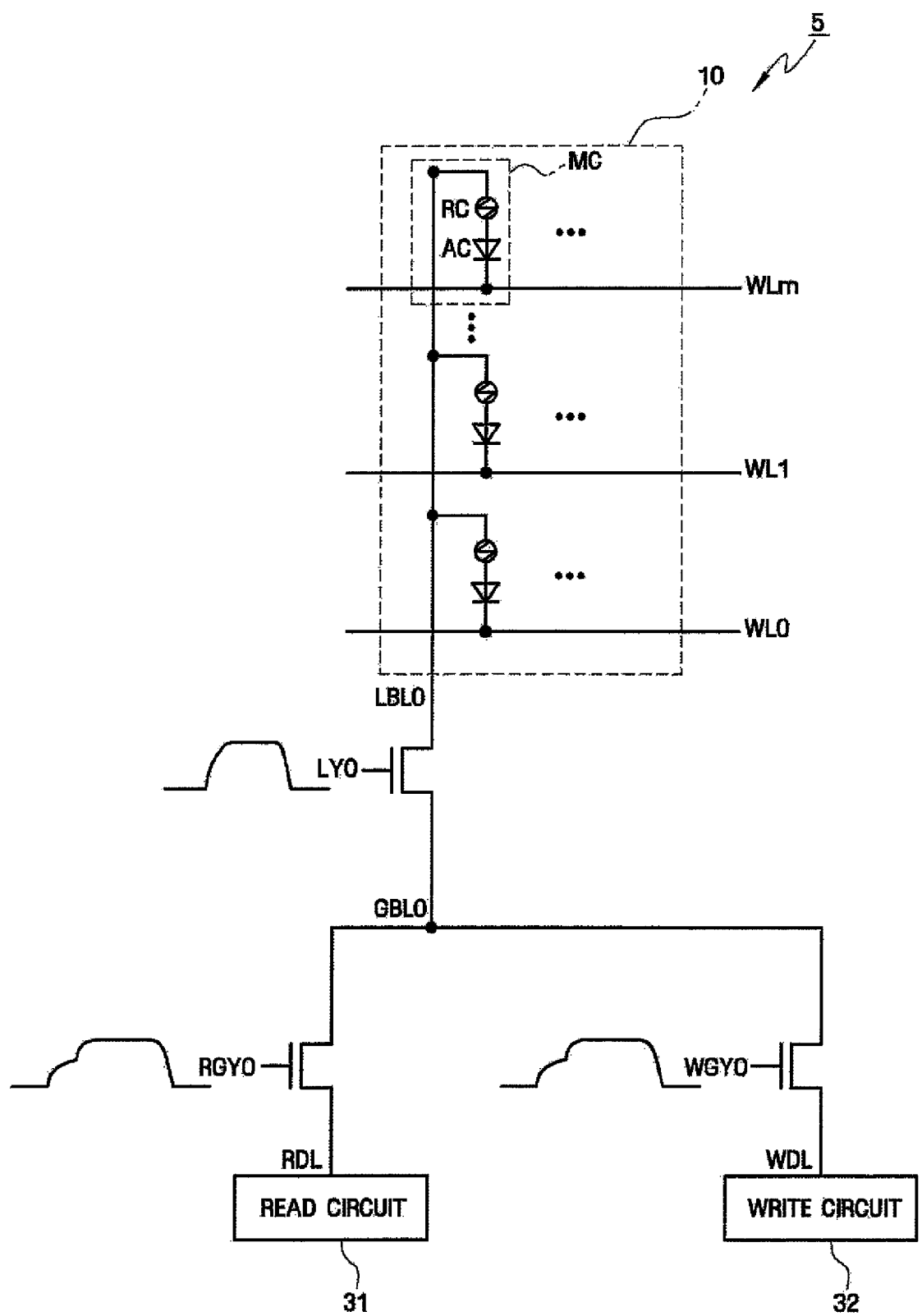
FIG. 10 is a block diagram illustrating a nonvolatile memory device according to a fifth exemplary embodiment of the present invention.

FIG. 9 is a block diagram illustrating a nonvolatile memory device 4 where local selection signal LY0 is increased to a certain level in multiple steps and first and second global selection signals RGY0, WGY0 are increased to a certain level in one step. FIG. 10 is a block diagram illustrating a nonvolatile memory device 5 where first and second global selection signals RGY0, WGY0 are increased to a certain level in multiple steps and local selection signal LY0 is increased to a certain level in one step. Alternatively, the local selection signal LY0 and the first global selection signal RGY0 can be increased to a certain level in multiple steps, and second global selection signal WGY0 can be increased to a certain level in one step. In addition, local selection signal LY0 and second global selection signal WGY0 can be increased to a certain level in multiple steps, and first global selection signal RGY0 can be increased to a certain level in one step.

Figure 11:
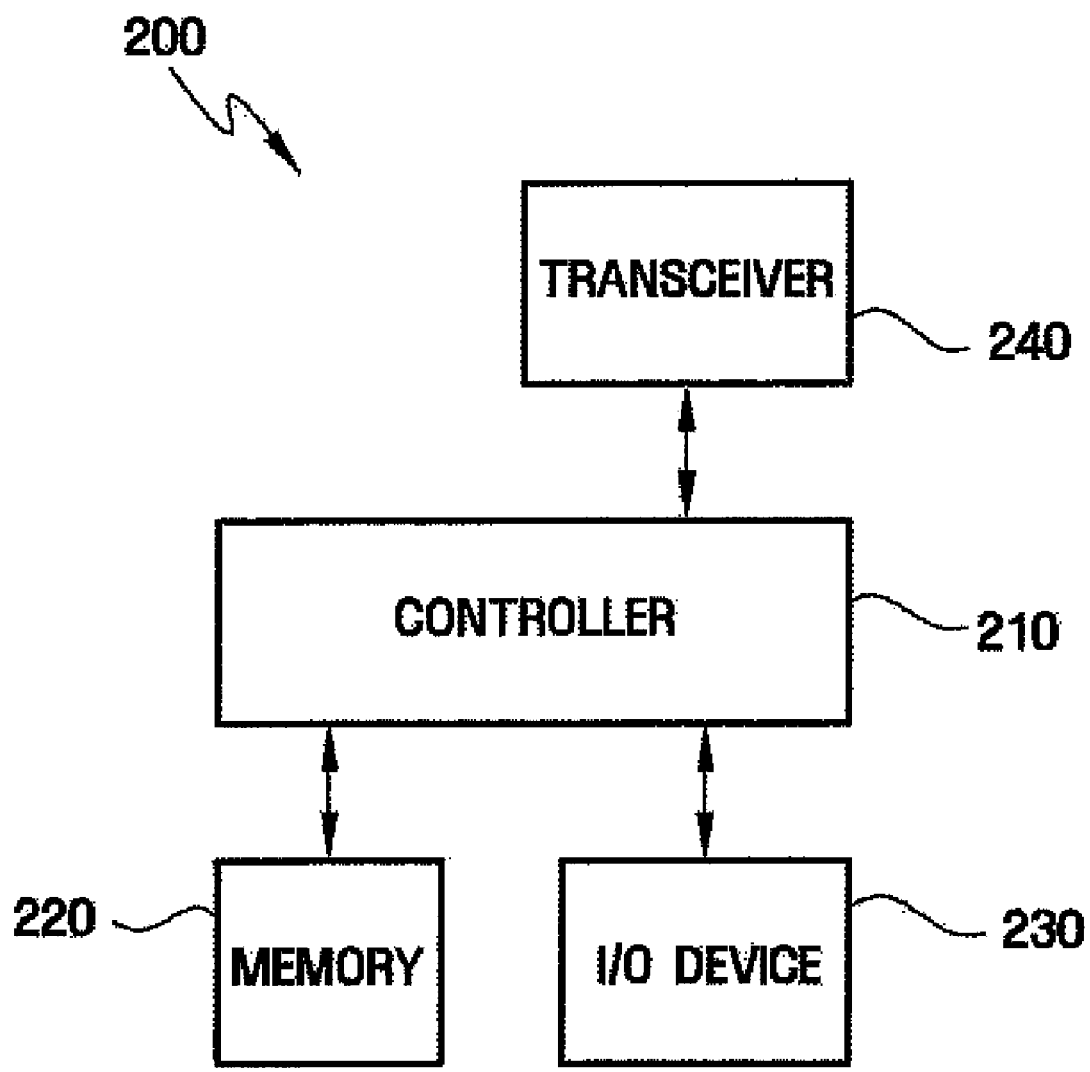
FIG. 11 is a conceptual view illustrating a portable media system including a nonvolatile memory device according to exemplary embodiments of the present invention.

FIG. 11 is a conceptual view illustrating a portable phone as an example of a portable media system including a nonvolatile memory device in accordance with the present invention. A nonvolatile memory device according to exemplary embodiments of the present invention can be used in other media systems including two-way communication devices, one way pager, two-way pagers, personal communication systems, computers, PDAs (Personal Data Assistance), MP3 (MPEG audio layer-3) players, and digital cameras. Portable media system 200 includes controller 210, memory 220, I/O device 230, and transceiver 240. Controller 210 can be a microprocessor, digital signal processor, or microcontroller. Memory 220 stores messages received by portable media system 200 or messages to be transmitted. Memory 220 stores data and/or instructions executed by controller 210 during the operation period of portable media system 200. Memory 200 consists of one or more different types of memories, for example, a volatile memory device or a nonvolatile memory device. In this case, the nonvolatile memory device according to the exemplary embodiments of the present invention is used.

Messages may be created by users via I/O device 230 which may include a keypad and a monitor. Portable media system 200 can send or receive messages via transceiver 240 connected to an antenna (not shown) using wireless communication methods. Portable media system 200 sends/receives messages using protocols including CDMA (Code Division Multiple Access), GSM (Global System for Mobile communication), NADC (North 20 American Digital Cellular), TDMA (Time Division Multiple Access), ETDMA (Extended TDMA), third generation WCDMA (Wideband CDMA), and CDMA-2000. More detailed descriptions of the present invention are explained using the following detailed simulations.

Simulations

Figure 12A:
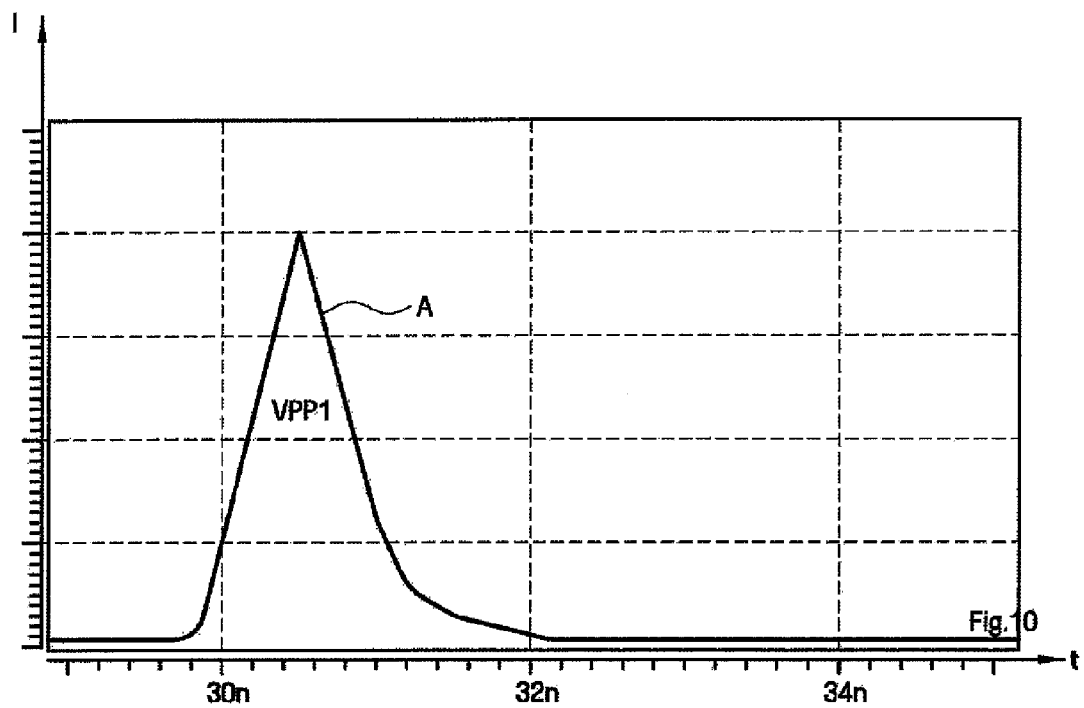
FIGS. 12A and 12B are simulation results of the nonvolatile memory device according to exemplary embodiments of the present invention.

FIG. 12A illustrates the result of a read operation of a nonvolatile memory device having a hierarchical bit line structure, HSPICE was used to simulate the current used to increase a local selection signal applied to a first column-selection transistor formed between a local bit line and a global bit line to a second voltage VPP1 level and to increase a first global selection signal applied to a second column-selection transistor formed in between global bit line coupled with a read circuit and a first data line to second voltage VPP1 level in one step.

Figure 12B:
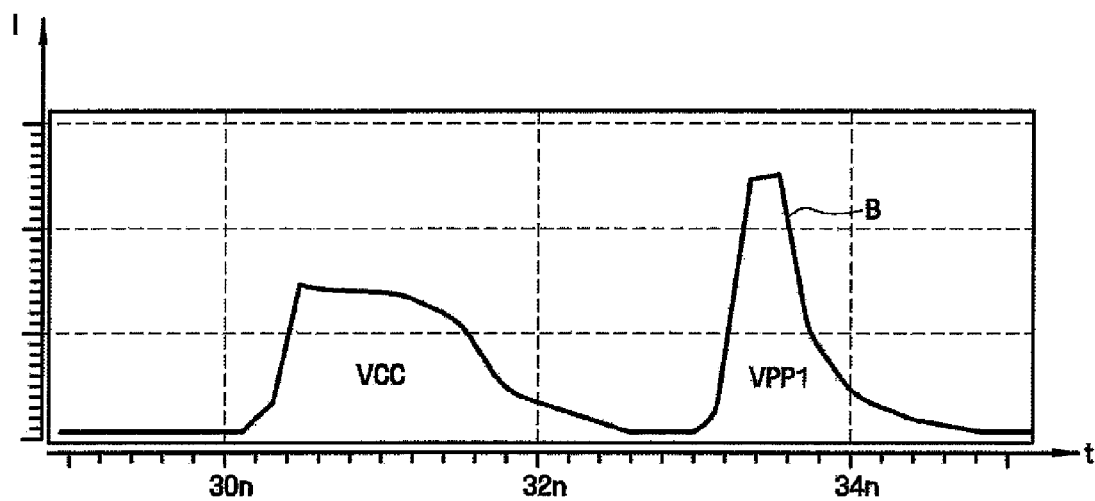

FIG. 12B illustrates the result of a read operation of a nonvolatile memory device having a hierarchical bit line structure, HSPICE was used to simulate the current used to increase the local selection signal applied to the first column-selection transistor formed between the local bit line and the global bit line and the first global selection signal applied to the second column-selection transistor formed between the global bit line coupled with the read circuit and the first data line to first voltage level VCC followed by a second voltage level increase to second voltage VPP1.

Referring to FIGS. 12A and 12B, the x-axis represents time and the y-axis represents current. The current level in case B where the voltage was increased to first voltage VCC followed by the second increase to second voltage VPP1 is much smaller than the current used in case A where the voltage was immediately increased to second voltage VPP1.

Since a nonvolatile memory device and associated operation methods described above use both the voltage provided outside the memory device and the voltage generated by the device inside instead of using only the voltage generated by the internal device, an instantaneous significant drop of a second voltage in a short period of time caused by using the second voltage generated by the voltage-generating circuit inside the memory device can be avoided. The malfunctions of the nonvolatile memory device associated with the circuits that use the second voltage can be avoided which increases device reliability. In addition, if the level of selection signal Yi is increased in multiple steps, the stress introduced to a phase change memory device by having selection signal Yi increased to a high voltage level (for example, a boosting voltage level) in a single step can be reduced.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A nonvolatile memory device comprising:
a plurality of nonvolatile memory cells;
a bit line coupled to at least a portion of said plurality of nonvolatile memory cells;
a column-selection transistor coupled to said bit line; and
a driving circuit coupled to a gate of said column-selection transistor and configured to charge said gate using a first voltage and thereafter to charge said gate using a second voltage during one operation mode, wherein said second voltage is higher than said first voltage.

2. The nonvolatile memory device of claim 1, wherein the first voltage is an external source voltage and the second voltage is a boosting voltage.

3. The nonvolatile memory device of claim 1 wherein said driving circuit is further configured to charge said gate of the column-selection transistor using a third voltage higher than said second voltage.

4. The nonvolatile memory device of claim 1, wherein the driving circuit comprises:
a first sub-driving unit configured to supply the first voltage in response to a first control signal; and
a second sub-driving unit coupled to said first sub-driving unit, said second sub-driving unit configured to supply the second voltage in response to a second control signal.

5. The nonvolatile memory device of claim 4, further comprising:
a control circuit coupled to said first and second sub-driving units, said control circuit configured to supply the first control signal and the second control signal; and
a voltage-generating circuit coupled to said control circuit and configured to generate the second voltage.

6. The nonvolatile memory device of claim 1, wherein said bit line comprises a local bit line and a global bit line, said column-selection transistor comprised of a first column-selection transistor coupled between the local bit line and the global bit line and a second column-selection transistor coupled between the global bit line and a data line.

7. The nonvolatile memory device of claim 6, wherein said driving circuit is further configured to charge a gate of said first column-selection transistor using said first voltage, and to charge the gate of the first column-selection transistor using the second voltage, wherein said second voltage is higher than said first voltage.

8. The nonvolatile memory device of claim 7, wherein the driving circuit is coupled to and is configured to charge a gate of the second column-selection transistor using the first voltage, said driving circuit supplying charge to said gate of the second column-selection transistor using the second voltage wherein said second voltage is higher than said first voltage.

9. The nonvolatile memory device of claim 1, wherein the bit line comprises a local bit line coupled to at least one of said plurality of nonvolatile memory cells and a global bit line, said nonvolatile memory device further comprising:
a column-selection transistor having a first column-selection transistor coupled between the local bit line and the global bit line;
a second column-selection transistor coupled between a first data line which is coupled to a read circuit and the global bit line; and
a third column-selection transistor coupled between a second data line which is coupled with a write circuit and the global bit line,
said driving circuit coupled to and configured to charge a gate of the first column-selection transistor using the first voltage and the second voltage wherein said second voltage is higher than the first voltage, said driving circuit also coupled to and configured to charge a gate of the second column-selection transistor using the first voltage and the second voltage wherein said second voltage is higher than the first voltage, said driving circuit coupled to and configured to charge a gate of the third column-selection transistor using the first voltage and the second voltage wherein said second voltage is higher than the first voltage.

10. The nonvolatile memory device of claim 1, wherein the nonvolatile memory cells are phase change memory cells.

11. A nonvolatile memory device comprising:
a plurality of bit lines where each bit line is coupled to at least one nonvolatile memory cell;
a column selection circuit coupled to the plurality of bit lines, said column selection circuit configured to select at least one bit line from among the plurality of bit lines by responding to a selection signal; and
a driving circuit coupled to the column selection circuit and configured to generate the selection signal using both a first external voltage and a second internal voltage during one operation mode.

12. The nonvolatile memory device of claim 11, wherein the second internal voltage is higher than the first external voltage.

13. The nonvolatile memory device of claim 11, wherein the second internal voltage is a boosting voltage generated using the first external voltage.

14. A nonvolatile memory device comprising:
a plurality of bit lines where each of the bit lines is coupled to at least one nonvolatile memory cell;
a column selection circuit coupled to the plurality of bit lines, said column selection circuit configured to select at least one bit line from among the plurality of bit lines by responding to a selection signal; and
a driving circuit coupled to the column selection circuit and configured to provide the selection signal which is increased to a predetermined level in multiple steps during one operation mode.

15. The nonvolatile memory device of claim 14, wherein the selection signal is increased to the predetermined level in two steps.

16. The nonvolatile memory device of claim 14, wherein the driving circuit generates the selection signal using an external source voltage and an internal boosting voltage.

17. A method of operating a nonvolatile memory device, comprising:

providing a nonvolatile memory device including a bit line which is coupled to one of a plurality of nonvolatile memory cells and a column-selection transistor coupled to the bit line;

first charging a gate of the column-selection transistor using a first voltage; and thereafter, second charging the gate of the column-selection transistor using a second voltage, wherein said second voltage is higher than the first voltage, and said first and second charging are performed during one operation mode.

18. The method of claim 17, wherein the first voltage is an external source voltage and the second voltage is a boosting voltage.

19. The method of claim 17, further comprising providing a read current to said non-volatile memory device to read data stored in the nonvolatile memory cell.

20. The method of claim 17, further comprising providing a write current to said non-volatile memory device to write data to at least one of said plurality of nonvolatile memory cells.

\* \* \* \* \*